United States Patent [19]

Evans

[11] 3,809,928

[45] May 7, 1974

[54] INTEGRATED STRUCTURE AMPLIFIER WITH THERMAL FEEDBACK

[75] Inventor: Lee L. Evans, Santa Clara, Calif.

[73] Assignee: Texas Instruments Incorporated, Dallas, Tex.

[22] Filed: Aug. 1, 1966

[21] Appl. No.: 569,533

Related U.S. Application Data

[63] Continuation of Ser. No. 222,235, Sept. 7, 1962, abandoned.

[52] U.S. Cl. ................ 307/303, 330/38 M, 330/23, 330/143, 307/297, 307/310

[51] Int. Cl. .................................... H03f 1/30

[58] Field of Search .......... 307/88.5, 297, 303, 310; 317/101; 330/38 M, 23, 24, 30 D, 19, 143

[56] References Cited

UNITED STATES PATENTS

| | | | |
|---|---|---|---|
| 3,358,152 | 12/1967 | Alexakis | 307/297 X |
| 3,050,644 | 9/1962 | Ironside | 330/23 X |
| 3,070,750 | 12/1962 | Farber | 330/24 X |
| 3,089,098 | 5/1963 | Noe | 330/19 |
| 3,128,431 | 4/1964 | Walker | 330/23 X |

*Primary Examiner*—John S. Heyman
*Attorney, Agent, or Firm*—Harold Levine; Edward J. Connors, Jr.; John G. Graham

[57] ABSTRACT

A high gain A.C. transistorized amplifier circuit is fabricated into a single body of semiconductor material. The negative feedback circuit to stabilize the amplifier connected between the output and input of the amplifier and the temperature compensating means connected to the output of the amplifier are both thermally connected to the input stage but also isolated from said stage through said body. Therefore heating effects on the amplifier is minimized and the need for large values of capacitors and inductors in the feedback circuit are avoided.

15 Claims, 6 Drawing Figures

Lee L. Evans
INVENTOR

BY John D. Graham

ATTORNEY

Lee L. Evans
INVENTOR

BY John D. Graham

ATTORNEY

INTEGRATED STRUCTURE AMPLIFIER WITH THERMAL FEEDBACK

This application is a continuation of Ser. No. 222,235 filed Sept. 7, 1962, and now abandoned.

This invention relates to electronic circuits utilizing thermal effects in various components, and has particular application in DC stabilization of an amplifier circuit or thermal stabilization of a semiconductor device by thermal negative feedback.

One of the most significant trends in electronics is in the miniaturization of components and circuits. It is now possible to incorporate entire functional blocks such as amplifiers or multivibrators into one or more small semiconductor wafers which may be mounted in an extremely small package. The close spacing and integral connections between elements in such a functional block produces inherent interaction between thermal and electrical characteristics of the components. While this interaction ordinarily degrades performance, it can be utilized to advantage in some instances, as will be seen by this invention. Transistors and diodes for these miniature circuits are formed by the usual techniques, but resistors and capacitors are quite different from the commonly-used components in that they must be formed in or on the semiconductor material. It has been difficult to provide large-value capacitors and resistors for integrated circuits due to the size limitations, and so the low frequency or DC characteristics of the circuits have been compromised to some extent.

In a high gain AC amplifier, for example, the operating or bias point is ordinarily stabilized by DC feedback, requiring large capacitors or inductors in a filter. Without this DC negative feedback, the amplifier would have as large a DC gain as it had AC gain. The operating point would shift severely with temperature, cutting off or saturating the last stage of a high gain amplifier. Also, it would be exceedingly hard to bias the amplifier in a linear range even at a constant temperature without DC negative feedback, since this would require very careful selection and matching of components. The fact that large value capacitors and inductors are not readily available in integrated circuit form makes the construction of a stabilized high gain amplifier quite difficult.

Since the characteristics of semiconductor devices are quite dependent upon temperature, it is highly desirable to maintain an integrated circuit device at a constant temperature. This must be done by means which are compatible in size, power requirements, etc., with the functional blocks. As will be seen by one embodiment of this invention, a temperature-stabilized substrate may be provided by utilizing thermal feedback from one semiconductor element to another.

It is the principal object of this invention to provide a low frequency or DC feedback or coupling technique suitable for use in integrated circuits. Another object is to make use of the interaction between thermal and electrical characteristics of semiconductor components to provide functions such as DC negative feedback. An additional object is to provide a high-gain, stabilized, AC amplifier which does not require reactive elements for coupling or feedback. A further object is to provide a temperature stabilized semiconductor network.

In accordance with this invention, a transistor or other component which changes its electrical characteristics in response to temperature is positioned in thermal contact with a resistor or other component which varies in temperature in response to an electrical property such as current. In one embodiment, the transistor is in an input stage of a high gain, direct-coupled AC amplifier, and the resistor is in the output circuit. With this arrangement, DC negative feedback is provided since an increase in output current will heat the resistor and its associated transistor, changing the characteristics of the latter in such a way as to result in a decrease in output current. In another embodiment, a transistor in one stage of a circuit is in thermal contact with a transistor in a later stage, providing feedback which can be used for temperature stabilization.

The novel features which are believed to be characteristic of this invention are set forth in the appended claims. The invention may best be understood, however, by reference to the following detailed description of illustrative embodiments, read in conjunction with the accompanying drawings, wherein:

Figure 1:
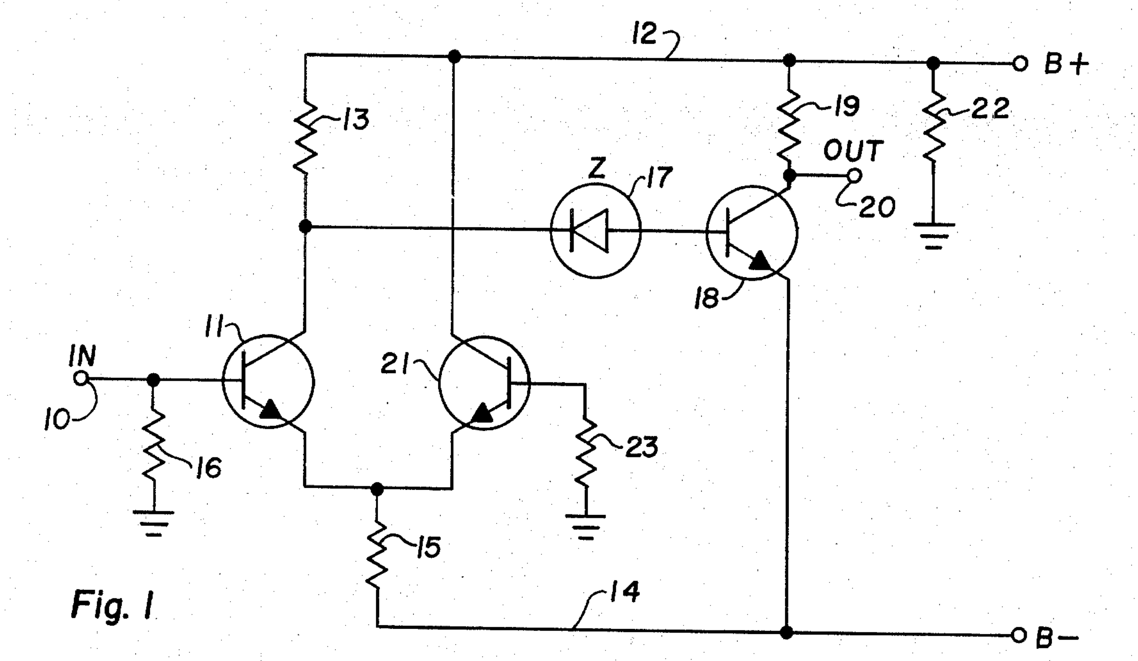
FIG. 1 is a schematic diagram of an amplifier circuit which may use the principles of this invention.

With reference to FIG. 1, a high gain amplifier is illustrated which is particularly well adapted for utilizing the thermal feedback concept of this invention. An input terminal 10 which may be coupled to a low-level AC signal source, is connected to the base of a transistor 11 in a first amplifying stage. The collector of this transistor 11 is connected to a positive voltage supply line 12 through a load resistor 13, while the emitter is connected to a negative voltage supply line 14 through an emitter resistor 15. The base of the transistor 11 is connected to ground through a suitable bias resistor 16 so that this stage will be operating in an acceptable linear range of the transistor's characteristic. A signal applied to the input terminal 10 will appear in an amplified form on the collector of the transistor 11, and this amplified signal is coupled through a Zener diode 17 to the base of a transistor 18 in a second amplifying stage. The Zener diode is used as a coupling element in lieu of a capacitor since the diode is easier to fabricate in integrated circuit form. The reverse voltage drop across this diode 17 reduces the relatively high DC level on the collector of the first stage to an acceptable level for base bias on the second stage. The emitter of the transistor 18 is directly connected to the negative supply line 14, while the collector is connected through a load resistor 19 to the positive line 12. This second stage also functions as an amplifier, and signals applied to the base of the transistor 18 appear in further amplified form on an output terminal 20.

Since DC coupling is used in the amplifier circuit of FIG. 1, a slight change in the level of the input, or of the operating point of the transistor 11, may drive the transistor 18 into saturation or cutoff. Accordingly, negative feedback for DC and very low frequencies is provided by mounting or positioning the transistor 11 in thermal contact with the resistor 19. Another transistor 21, connected differentially with the transistor 11, is mounted in thermal contact with a resistor 22 to provide a reference. The transistor 21 is biased at a selected point by a resistor 23 connected from the base to ground. The resistor 23 may well have the same value as the resistor 16 to provide a balanced circuit.

In operation, if the resistor 19 draws too much current, due to saturation of the transistor 18, this will heat the transistor 11, reducing its base-emitter voltage for a constant current. However, the transistor 11 will draw more current due to the increased temperature, and the transistor 21 will draw correspondingly less, since these transistors are connected differentially or have a common emitter resistor. This increased current in the resistor 13 will lower the base bias on the transistor 18 and reduce the current in the latter, effecting negative DC feedback. In a like manner, if the transistor 18 is driven to cutoff, its collector current will decrease and the resistor 19 will cool, reducing the collector current in the transistor 11 and causing an increase in the bias on the transistor 18 so that it will be driven out of cutoff. The resistor 22, not being affected by signal or output current, will be maintained at a temperature dependent upon the supply voltage and will heat the transistor 21 accordingly, acting as a standard. If the transistors 11 and 21 are balanced or matched, the circuit will maintain a steady-state bias point where the temperature of the resistor 19 is equal to the temperature of the resistor 22. If these resistors 19 and 22 are equal and thermally symmetrical, the circuit may provide a steady-state bias point with the output at ground potential.

The circuit of FIG. 1 will pass AC from the input 10 to the output 20 at full gain since the thermal inertia or capacity of the resistors 19 and 22 will not allow the temperature to follow the AC signal. The maximum in feedback results when the change in temperature of the resistors per unit change in power is high.

Figure 2:
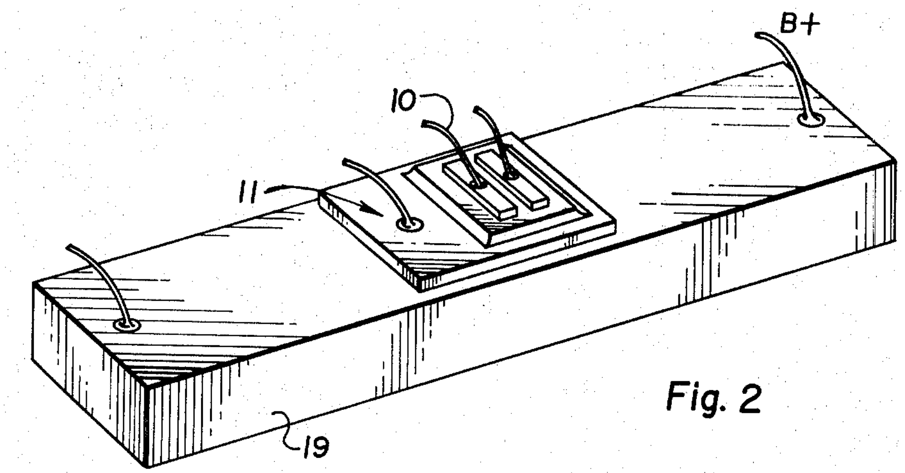
FIG. 2 is a pictorial view of a transistor mounted on a semiconductor resistor as used in the circuit of FIG. 1.

In semiconductor network or integrated circuit applications, the resistors 19 and 22 may well taken the form of elongated bars of monocrystalline silicon, or elongated paths in silicon wafers defined by P-N junctions. In FIG. 2, an example of a suitable manner of mounting the transistor 11 on the semiconductor bar which forms the resistor 19 is illustrated. This transistor comprises a wafer 25 of silicon, the major bulk of which provides the collector region. The wafer is mounted on, but electrically insulated from, the resistor bar 19 by means of a cement such as solder glass. The wafer 25 may provide a mesa-type transistor, as illustrated, and base and emitter leads are attached to base and emitter stripes 26 and 27 on the top surface of the mesa. A collector contact 28 is also made on the top surface of the wafer 25, spaced from the mesa. The transistor 21 also would be physically mounted on the resistor 22 by cementing the semiconductor wafer which forms this transistor to the semiconductor bar which forms the resistor in a manner similar to FIG. 2. Alternatively, a resistor and its associated transistor could be formed in the same wafer of monocrystalline silicon, electrically separated from one another by P-N junctions. The transistors obviously could be of other configuration, such as double-diffused planar. The feature of interest here is merely that the two components be in intimate, heat conducting relation, but electrically insulated.

Figure 3:
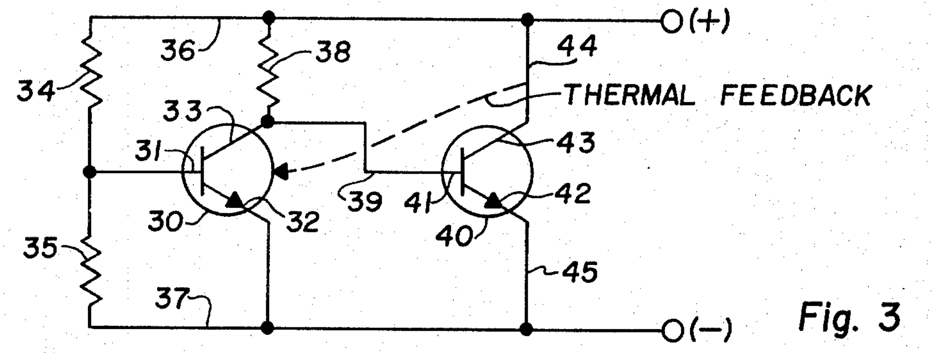
FIG. 3 is a schematic diagram of a circuit which may be used in semiconductor network form to provide a temperature-stabilized substrate in accordance with another embodiment of this invention.

Referring now to FIG. 3, a circuit is illustrated which uses thermal negative feedback to provide a stabilized temperature for a semiconductor network substrate. This circuit would be fabricated with the two transistors in intimate, heat conducting relationship as provided by the semiconductor network of FIG. 4, for example. A first transistor 30 is employed having a base 31, an emitter 32 and a collector 33. The base 31 is biased at a point such that initially the transistor is slightly below cutoff. For a silicon transistor this would be about 0.4 volts. This bias is provided by a large resistor 34 and a much smaller resistor 35 connected as a voltage divider across positive and negative supply lines 36 and 37. The collector 33 is connected to the line 36 through a resistor 38, while the emitter 32 is directly connected to the negative line 37, providing a grounded-emitter amplifier stage. The collector of the first transistor is further connected by a conductor 39 to the base of second transistor 40. This transistor likewise includes a base 41, an emitter 42 and a collector 43, with the collector and emitter being directly connected to the positive and negative lines 36 and 37 by conductors 44 and 45, respectively. Thermal feedback is provided between the region adjacent the collector of the transistor 40 and the body of the transistor 30 by fabricating both transistors in a single silicon wafer 50 as seen in FIG. 4 and described in more detail below.

In operation, the second transistor in the circuit of FIG. 3 will be initially biased for heavy conduction by base-emitter current flowing through the resistor 38 and the conductor 39. Conduction of this transistor 40 will tend to heat the silicon wafer 50 in the region of the collector 43 due to power dissipation, primarily near the collector-base junction. Heat in the area of the collector 43 will be transmitted through the silicon wafer to the transistor 30, and will cause a reduction in the base-emitter voltage necessary to cut on the transistor 30. The voltage on the base 31 is maintained constant by the voltage divider, so when the temperature of the transistor 30 reaches a point where the fixed base voltage is adequate to turn it on, collector current will begin to flow. This will reduce the voltage on the line 39, decreasing the base-emitter bias current for the transistor 40. Collector current will therefore decrease in the transistor 40. Collector reducing its collector dissipation and the heat fed back to the transistor 30. The circuit will tend to stabilize at an operating point, perhaps 125°C, where the temperature of the wafer 50 is at some value such that the transistor 30 is biased slightly into the conducting region and the transistor 40 is conducting fairly heavily.

A diode 51 is also provided in the wafer 50 so that the stable temperature of the substrate may be used to provide a stable voltage reference. The diode 51 may be connected externally to a current source and biased in the reverse direction past the Zener breakdown point. The voltage across the diode will be constant, since the temperature of the semiconductor material making up the diode is relatively constant. Of course, other components could be used as the reference element, a Zener diode being shown as an example.

Figure 4:
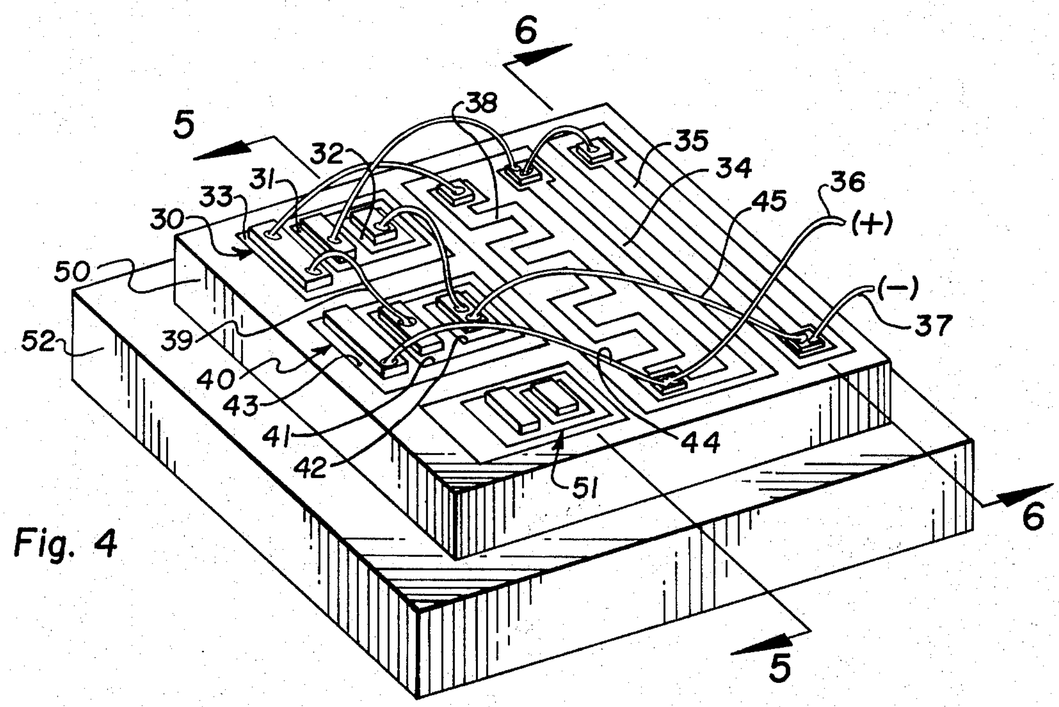
FIG. 4 is a pictorial view of the apparatus of FIG. 3 in integrated circuit form.
Figure 5:
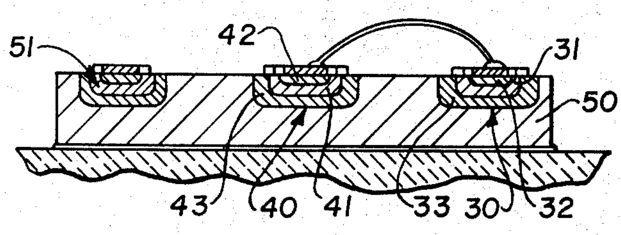
FIG. 5 is a sectional view of the integrated circuit of FIG. 4 taken along the line 5—5.
Figure 6:
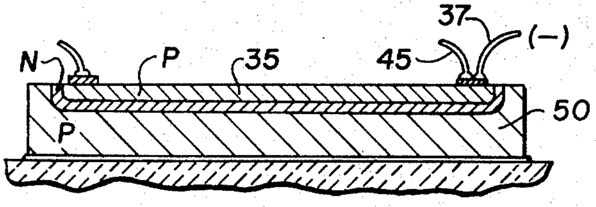
FIG. 6 is a sectional view of the integrated circuit of FIG. 4 taken along the line 6—6.

With reference to FIG. 4, and the sectional views thereof in FIGS. 5 and 6, the entire temperature stabilization circuit may be fabricated in planar form by using conventional procedures with oxide masking. The transistors 30 and 40 are of the triple-diffused N-P-N type, with the collectors, bases and emitters being formed by successive diffusion steps into the P-type wafer 50 in the named order. The Zener diode 51 would be of the same configuration as a transistor, but only the base and emitter regions would be used as the active portion, what would be a collector in a transistor serving here to electrically isolate the diode from the remainder of the circuit. The resistors are shown to be fabricated in the same wafer 50 as the transistors and diode, but could be in a separate wafer. The resistors are elongated P-type diffused regions formed simultaneously with the base regions of the transistors. The resistors are isolated from one another and from the remainder of the circuit by N-type regions formed at the same time as the collectors of the transistors. Interconnections between various elements of the circuit can be made as shown by leads which are thermocompression bonded to deposited contacts on the appropriate regions of the semiconductor material. Obviously, connections could be made by evaporating appropriate patterns of aluminum on top of the silicon oxide coating which is left on the wafer after the diffusions. The wafer 50 is mounted by a cement such as solder glass onto a heat-insulating plate 52 which may be a ceramic wafer. This serves to hold the power required for operation of the circuit to a minimum. The assembly would be packaged in any suitable manner.

While this invention has been described with reference to particular embodiments, this description is not meant to be construed in a limiting sense. Various modifications of the illustrated embodiments, as well as other embodiments of the invention, will be apparent to persons skilled in the art upon reading this description. Accordingly, it is contemplated that the appended claims will be interpreted to cover any such modifications or embodiments as fall within the true scope of the invention.

What is claimed is:

1. An electrical circuit comprising:
a. a first stage including a transistor having input, output and common electrodes and formed in a single body of semiconductor material,
b. means to supply operating bias to the input and common electrodes and to the output and common electrodes of the transistor,
c. a second stage including an amplifying element having input, output and common electrodes, said amplifying element being formed in said single body of semiconductor material,
d. means to supply operating bias to the input and common electrodes and to the output and common electrodes of the amplifying element,
e. conductive means coupling the output electrode of the transistor to the input electrode of the amplifying element so that the output current of the latter will be dependent upon the output current of the former,
f. and temperature responsive means coupled to the output of said amplifying element and being formed in said single body of semiconductor material in said temperature responsive means varying temperature in response to the magnitude of current applied thereto and being thermally coupled to said transistor but electrically isolated therefrom through said body of semiconductor material, whereby the output current of said transistor will vary according to the output current of the amplifying element.

2. Apparatus according to claim 1 wherein said temperature responsive means comprises an elongated region of monocrystalline semiconductor material forming the load resistor for the second stage.

3. A stabilized amplifier circuit comprising:
a. a first transistor having a base, an emitter and a collector formed in a single body of semiconductor material,
b. means for applying an AC signal to the base of the first transistor,
c. means including a collector load impedance connecting the collector and emitter of the first transistor to an operating bias source,
d. a second transistor having a base, an emitter and a collector, said second transistor being formed in said single body of semiconductor material,
e. coupling means connecting the collector of the first transistor to the base of the second transistor,
f. means including a collector load resistor formed in said single body of semiconductor material and connecting the collector and emitter of the second transistor to an operating bias source, said collector resistor varying in temperature in response to current supplied thereto, and
g. means for maintaining said collector resistor and said first transistor in intimate, heat conducting relationship but electrically isolated from each other through said single body of semiconductor material so that conduction of the first transistor will vary in relation to the collector current of the second transistor to provide thermal negative feedback for DC stabilization.

4. An amplifier circuit comprising:
a. a first transistor formed in a body of semiconductor material and having a base, an emitter and a collector,
b. means for applying a signal to the base of the first transistor,
c. load resistance means connecting the collector of the first transistor to a DC supply of one polarity,
d. means including an emitter resistor connecting the emitter of the first transistor to a DC supply of the opposite polarity,
e. a second transistor having a base, an emitter and a collector, the collector being directly connected to the DC supply of one polarity and the emitter being connected through the emitter resistor to the DC supply of the opposite polarity,
f. means for biasing the base of the second transistor so that the first and second transistors act as a differential pair,
g. a third transistor having a base, an emitter and a collector, the emitter being connected to the DC supply of the opposite polarity,
h. coupling means including a Zener diode connecting the collector of the first transistor to the base of the third transistor,
i. second load resistance means formed in said body of semiconductor material and connecting the collector of the third transistor to the DC supply of one polarity, j. the first transistor being thermally coupled to the second load resistance means through said body of semiconductor material so that the conduction of the first transistor will vary according to the current flow in the second load resistance means and the associated heat produced by said current flow, thereby providing thermal negative feedback at very low frequencies, k. and reference resistor means connected across a DC supply, with the second transistor being positioned in intimate, heat-conducting relationship thereto.

5. Apparatus for stabilizing the temperature of a semiconductor wafer comprising:

a. a first transistor formed in said wafer and having base, emitter and collector regions said first transistor having electrical characteristics responsive to changes in temperature, b. means including a collector load resistor formed in said wafer and connecting the collector and emitter of the first transistor across a voltage supply, c. means for biasing the base of the first transistor at a fixed level, d. a second transistor formed in said wafer and having base, emitter and collector regions, e. means connecting the collector and emitter of the second transistor across a voltage supply, f. the base of the second transistor being coupled to the collector of the first transistor, g. the first transistor being thermally coupled with the collector region of the second transistor through said semiconductor wafer but electrically isolated therefrom, whereby conduction in the first transistor is dependent upon collector dissipation in the second transistor, h. the second transistor conducting substantially more current than the first transistor so that power dissipation in the vicinity of the collector region of the second transistor is substantially greater than that in the vicinity of the collector region of the first transistor whereby heat flow through the semiconductor wafer is primarily from the second to the first transistor.

6. A temperature-stabilized voltage reference comprising:

a. a wafer of semiconductor material mounted on a heat-insulating base, b. first and second transistors formed in said wafer, each having base, emitter and collector regions, c. means connecting the collector and emitter of the second transistor across a voltage supply and means including a collector resistor connecting the collector and emitter of the first transistor across a voltage supply, d. means for biasing the base of the first transistor at a fixed level, e. means connecting the collector of the first transistor to the base of the second transistor, f. means for thermally coupling a portion of said wafer adjacent the junction between the base and emitter of the first transistor through said wafer to the collector region of the second transistor, whereby said semiconductor substrate reaches a predetermined temperature at which stabilization occurs, g. a p-n junction diode formed in the wafer adjacent the first and second transistors and thermally coupled thereto, thereby being maintained at said predetermined temperature, h. and means for back-biasing the diode past the Zener breakdown point, whereby the voltage across said diode remains substantially constant.

7. An electrical circuit utilizing thermal coupling between stages comprising:

a. a body of a semiconductor material;

b. a variable heat source formed in said body at a first position, the variable heat source including a transistor having a base, an emitter and a collector and means for applying operating bias to the collector and emitter, variations in the voltage applied to the base varying the collector current of the transistor and the power dissipation therein;

c. a heat sensor formed in said body at a second position, the heat sensor including electrical means for producing a voltage related to the temperature of the body at said second position, the power dissipation in said heat sensor being substantially less than that in said heat source;

d. a thermal coupling path within the body between said first and second positions;

e. and means for electrically connecting said electrical means to the base of said transistor whereby the voltage on said base varies according to the voltage produced by said electrical means.

8. An arrangement for maintaining a constant temperature environment for semiconductor circuit elements comprising, at least one heating semiconductor device for dissipating heat in accordance with the current flowing therethrough, at least one semiconductor circuit element to be maintained at a constant temperature, a substrate common to said heating device and circuit element and in good thermal contact therewith, and temperature sensing transistor having an emitter, a base, a collector, and a base-emitter junction, said transistor in good thermal contact with said substrate for producing a control voltage signal across said base emitter junction in proportion to the temperature of said substrate, said temperature sensing transistor being coupled to each of said heating semiconductor device to control said current therethrough in accordance with said control voltage signal to maintain a constant temperature in said substrate and therefore in the vicinity of each of said circuit elements.

9. An arrangement according to claim 1, where said substrate is of semiconducting material and said circuit elements, said heating devices, and said temperature sensing transistor respectively are semiconductor devices having said substrate as an integral component thereof.

10. An arrangement according to claim 1, wherein said substrate is a monolithic structure and said circuit elements, said heating devices, and said temperature sensing transistor respectively are semiconductor devices contained in mutually electrically isolated relation in said monolithic structure.

11. An arrangement according to claim 1, wherein said substrate is of insulating ceramic material, and said circuit element, said heating devices, and said temperature sensing transistor respectively are separate semiconductor devices mounted upon said substrate in good thermal contact therewith.

12. An arrangement for establishing a constant temperature environment for semiconductor circuit elements comprising a substrate, at least one semiconductor circuit element in good thermal contact with said substrate, at least one heating semiconductor device in good thermal contact with said substrate in the vicinity of said circuit elements, said heating device dissipating heat in said substrate as a direct function of current flowing through the heating device, a heat-sensing transistor having an emitter-base junction in good thermal contact with said substrate for producing a voltage across said emitter-base junction signal which varies as an inverse function of the temperature of said substrate, and means coupling said heat-sensing transistor to said heating device for controlling the flow of current through the latter as a direct function of said voltage signal to thereby maintain a constant temperature in said substrate and in said circuit elements.

13. Means for stabilizing the parameters of a transistor against drift and variation due to changes in the operating temperature of the transistor chip comprising:

a. electrically energizable heat generating means electrically insulated from but in direct thermally conductive contact with the body of the chip for applying heat directly to the chip;

b. energizing means adapted to be connected to a source of electrical energy for providing a continuous flow of electrical energy to said heat generating means; and c. temperature sensing means coupled to said energizing means and adapted to detect variations in temperature, for maintaining the chip at a substantially constant predetermined temperature, by controlling said energizing means to regulate the continuous flow of electrical energy to said heat generating means.

14. Apparatus as in claim 13, above, wherein said energizing means include an amplifier coupled to receive the output of said temperature sensing means.

15. Means for stabilizing the temperature dependant parameters of a semi-conductor chip comprising:

a. electrically energizable heat generating means electrically insulated from but in direct thermally conductive contact with the body of the chip for applying heat directly to the chip;

b. temperature sensitive energizing means, adapted to be connected to a source of electrical energy for providing a continuous flow of electrical energy to said heat generating means for maintaining the temperature of the chip at a substantially constant predetermined temperature, by regulating the continuous flow of electrical energy in response to variations in temperature.

* * * * *